(12) United States Patent
Yamada et al.

(10) Patent No.: US 12,361,874 B2
(45) Date of Patent: Jul. 15, 2025

(54) DISPLAY DEVICE

(71) Applicant: SHARP KABUSHIKI KAISHA, Sakai (JP)

(72) Inventors: Junichi Yamada, Sakai (JP); Makoto Yokoyama, Sakai (JP); Naoki Ueda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/039,856

(22) PCT Filed: Dec. 1, 2020

(86) PCT No.: PCT/JP2020/044632
§ 371 (c)(1),
(2) Date: Jun. 1, 2023

(87) PCT Pub. No.: WO2022/118368
PCT Pub. Date: Jun. 9, 2022

(65) Prior Publication Data
US 2024/0029650 A1    Jan. 25, 2024

(51) Int. Cl.
*G09G 3/3233*    (2016.01)
*H10K 59/131*    (2023.01)

(52) U.S. Cl.
CPC ......... *G09G 3/3233* (2013.01); *H10K 59/131* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/0233* (2013.01); *G09G 2320/045* (2013.01)

(58) Field of Classification Search
CPC .......... H10K 59/131; G09G 2320/045; G09G 2320/0233; G09G 2310/08; G09G 2300/0861; G09G 2300/0842; G09G 2300/0819; G09G 2300/0426; G09G 3/3233; G09G 3/20; G09G 2310/0251; G09G 2320/0209
See application file for complete search history.

(56) References Cited

U.S. PATENT DOCUMENTS

2019/0197949 A1    6/2019    Kim et al.
2020/0043949 A1    2/2020    Lee et al.
2020/0410935 A1    12/2020   Kim et al.
(Continued)

FOREIGN PATENT DOCUMENTS

JP        2008292786 A    12/2008

*Primary Examiner* — Julie Anne Watko
(74) *Attorney, Agent, or Firm* — ScienBiziP, P.C.

(57) ABSTRACT

The display device includes a plurality of pixel circuits, a scanning line, an initialization control line, a light emission control line, an initialization voltage line, a first connection line, and a second connection line. The first connection line and the second connection line connect the scanning line to the initialization control line connected to, of the plurality of pixel circuits, a pixel circuit different from a pixel circuit to which the scanning line is connected. Each of the plurality of pixel circuits includes a light-emitting element, a drive transistor, a light emission control transistor, a writing control transistor, and an initialization transistor. The first connection line and the second connection line are formed in layers different from each other.

11 Claims, 6 Drawing Sheets

(56) References Cited

U.S. PATENT DOCUMENTS

2021/0175316 A1\* 6/2021 Furukawa ............ H10K 59/131
2022/0157242 A1 5/2022 Kim et al.
2022/0181425 A1\* 6/2022 Sakai .................... H10K 59/131
2023/0247868 A1\* 8/2023 Yamanaka ............ H10K 59/126

\* cited by examiner

DISPLAY DEVICE

TECHNICAL FIELD

The disclosure relates to a display device.

BACKGROUND ART

Organic electro luminescence (hereinafter, electro luminescence is referred to as EL) display devices (display devices) including pixel circuits including organic EL elements (light-emitting elements) have recently been disclosed (for example, see PTL1). The pixel circuit of the organic EL display device includes a drive transistor and a writing control transistor in addition to the organic EL element. Thin film transistors (hereinafter referred to as TFTs) are used for these transistors. The organic EL element is a kind of an electro-optical element and emits light at brightness corresponding to an amount of flowing current. The drive transistor is provided in series with the organic EL element, and controls the amount of current flowing through the organic EL element.

Variation and fluctuation occur in characteristics of the organic EL element and the drive transistor. Thus, variation and fluctuation in characteristics of these elements need to be compensated in order to perform higher image quality display in the organic EL display device. For the organic EL display device, a method for compensating the characteristics of the elements inside the pixel circuits and a method for compensating the characteristics of the elements outside the pixel circuits are known. In the organic EL display device, processing of initializing a gate terminal of the drive transistor may be performed before a voltage (hereinafter referred to as a data voltage) corresponding to an image signal is written to the pixel circuit.

CITATION LIST

Patent Literature

PTL1: JP 2008-292786 A

SUMMARY

Technical Problem

When a parasitic capacitance is generated in a signal line connected to a pixel circuit, initialization of the gate terminal of a drive transistor becomes insufficient due to the parasitic capacitance, and there is a possibility that image quality of a display image is deteriorated.

A main object of the disclosure is to provide a display device in which a decrease in image quality of a display image can be suppressed.

Solution to Problem

A display device according to an aspect of the disclosure includes a plurality of pixel circuits, a scanning line, an initialization control line, a light emission control line, an initialization voltage line, a first connection line, and a second connection line. The scanning line, the initialization control line, the light emission control line, and the initialization voltage line are connected to each of the plurality of pixel circuits. The first connection line and the second connection line connect the scanning line to the initialization control line connected to, of the plurality of pixel circuits, a pixel circuit different from a pixel circuit to which the scanning line is connected. Each of the plurality of pixel circuits includes a light-emitting element, a drive transistor configured to drive the light-emitting element, a light emission control transistor configured to control light emission of the light-emitting element, a writing control transistor configured to control writing of data to the pixel circuit, and an initialization transistor connected between a gate of the drive transistor and the initialization voltage line. The scanning line is connected to a gate of the writing control transistor. The initialization control line is connected to a gate of the initialization transistor. The light emission control line is connected to a gate of the light emission control transistor. The first connection line and the second connection line are formed in layers different from each other.

A display device according to an aspect of the disclosure includes a plurality of pixel circuits, a scanning line, an initialization control line, a light emission control line, an initialization voltage line, and a connection line. The scanning line, the initialization control line, the light emission control line, and the initialization voltage line are connected to each of the plurality of pixel circuits. The connection line connects the scanning line to the initialization control line connected to, of the plurality of pixel circuits, a pixel circuit different from a pixel circuit to which the scanning line is connected. Each of the plurality of pixel circuits includes a light-emitting element, a drive transistor configured to drive the light-emitting element, a light emission control transistor configured to control light emission of the light-emitting element, a writing control transistor configured to control writing of data to the pixel circuit, and an initialization transistor connected between a gate of the drive transistor and the initialization voltage line. The scanning line is connected to a gate of the writing control transistor. The initialization control line is connected to a gate of the initialization transistor. The light emission control line is connected to a gate of the light emission control transistor. The initialization voltage line does not intersect the connection line and intersects the initialization control line.

DESCRIPTION OF EMBODIMENTS

Figure 1:
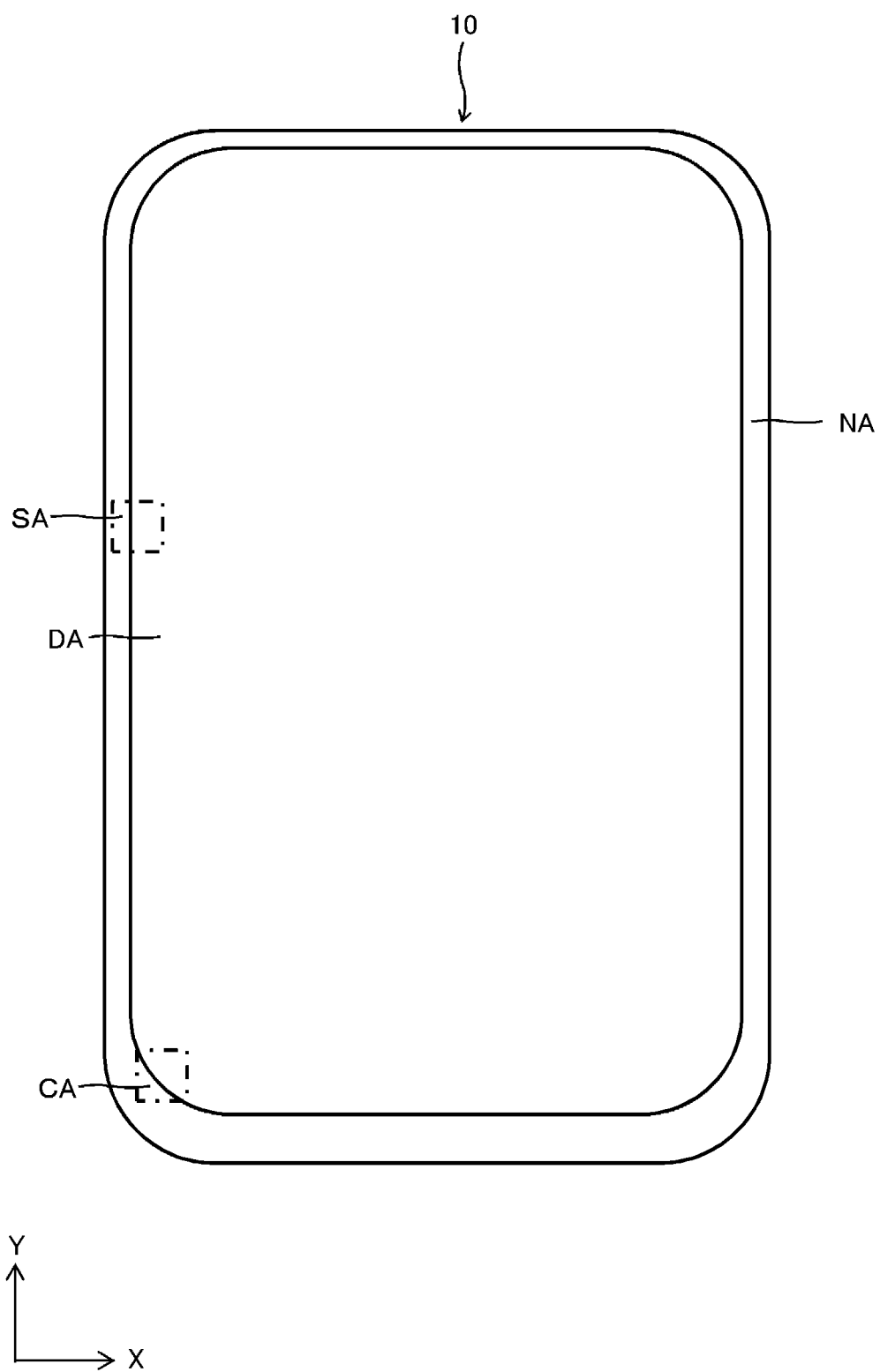
FIG. 1 is a schematic plan view of a display device according to an embodiment.

An example of preferable embodiments for carrying out the disclosure will be described hereinafter. However, the following embodiment is merely illustrative. The disclosure is not limited in any way to the following embodiment.

Further, in each of the drawings referred to in the embodiment and the like, members having substantially the same functions are referred to by the same reference signs. Further, the drawings referred to in the embodiment and the like are schematically illustrated. Ratios of dimensions and the like of objects depicted in the drawings may be different from ratios of dimensions and the like of actual objects. Ratios of dimensions and the like of objects may be different between the drawings. Specific ratios of dimensions and the like of objects should be determined in consideration of the following description.

EMBODIMENT

Figure 2:
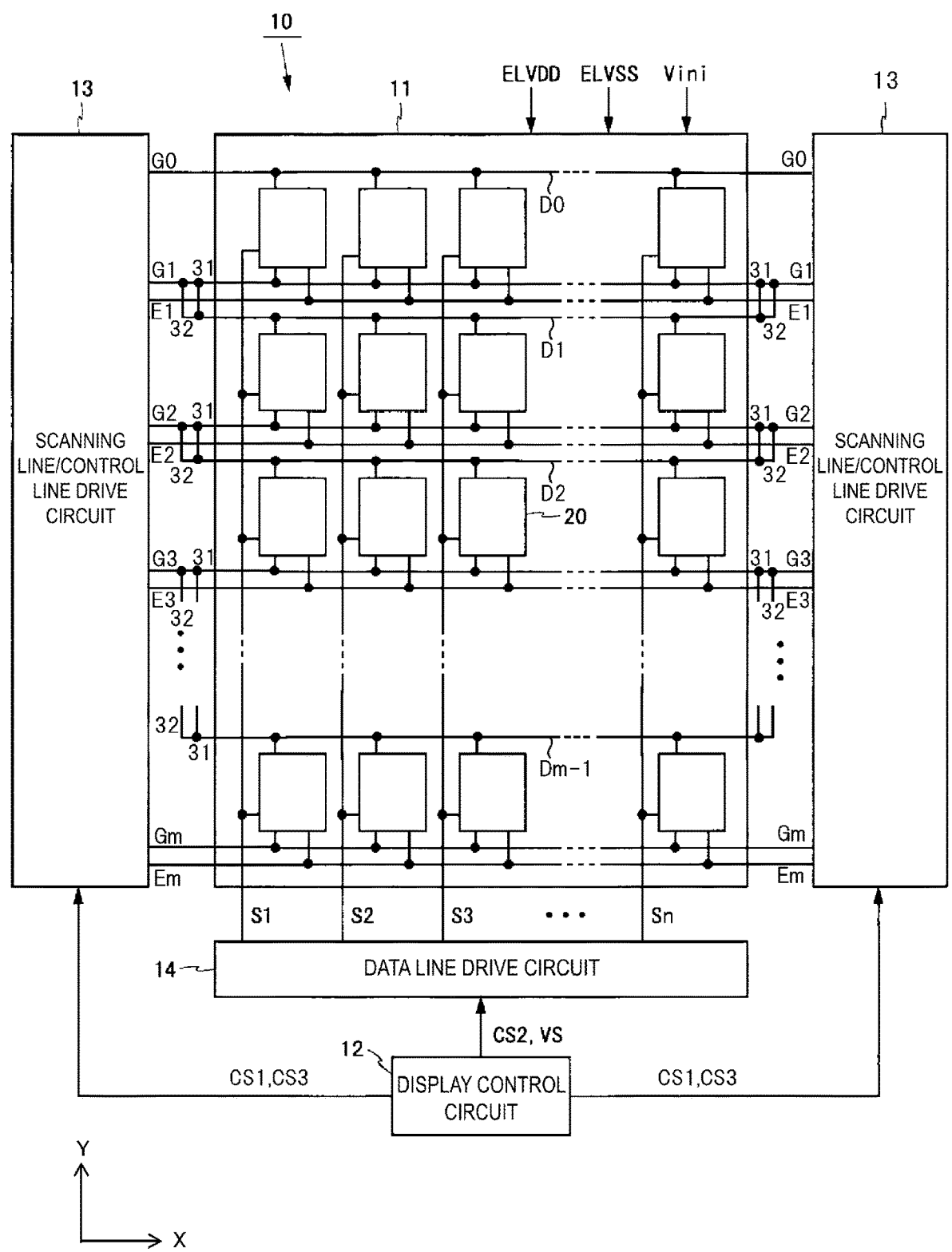
FIG. 2 is a block diagram of the display device described above.

With reference to FIG. 1 to FIG. 6, a display device 10 according to the present embodiment will be described. The display device 10 according to the present embodiment includes a display region DA having a rectangular shape with four curved corners, and a frame region NA being a non-display region, the frame region NA being formed around the display region DA. The display device 10 is an organic EL display device 10, and pixel circuits 20 (see FIG. 2 and FIG. 3) including organic EL elements as light-emitting elements L1 are provided in the display region DA. The organic EL element is a kind of electro-optical element, and is also called an organic light-emitting diode or an OLED. In the following description, a horizontal direction in FIG. 2 is referred to as a row direction (X direction), and a vertical direction in FIG. 2 is referred to as a column direction (Y direction). Further, in the following description, "m" and "n" represent integers larger than or equal to 2, "i" represents an integer larger than or equal to 1 and less than or equal to m, and "j" represents an integer larger than or equal to 1 and less than or equal to n. Further, as for the level of a voltage applied to the gate terminal of a transistor, the level of a voltage at which the transistor is turned on is referred to as an on level, and the level of a voltage at which the transistor is turned off is referred to as an off level. For example, in a P-channel type transistor, a high level is an off level, and a low level is an on level.

FIG. 2 is a block diagram illustrating a configuration of the display device 10 according to the present embodiment. The display device 10 includes a display portion 11, a display control circuit 12, a scanning line/control line drive circuit 13, and a data line drive circuit 14.

The display portion 11 includes m scanning lines G1 to Gm, n data lines Si to Sn, m light emission control lines E1 to Em, m initialization control lines D0 to Dm-1, and (m×n) pixel circuits 20.

The scanning lines G1 to Gm extend in the row direction and are arranged parallel to each other. The data lines Si to Sn extend in the column direction and are arranged parallel to each other. The scanning lines G1 to Gm and the data lines Si to Sn are orthogonal to each other. The light emission control lines E1 to Em and the initialization control lines D0 to Dm-1 extend in the row direction and are arranged parallel to the scanning lines G1 to Gm. The scanning lines G1 to Gm and the data lines S1 to Sn intersect each other at (m×n) positions. The (m×n) pixel circuits 20 are two-dimensionally arranged corresponding to the intersections of the scanning lines G1 to Gm and the data lines S1 to Sn. The pixel circuit 20 at the i-th row and j-th column is connected to the scanning line Gi, the data line Sj, the light emission control line Ei, and the initialization control line Di-1.

In addition, each of the plurality of pixel circuits 20 is constantly supplied with three kinds of voltages (a high-level power supply voltage ELVDD, a low-level power supply voltage ELVSS, and an initialization voltage Vini) by using a conductive member (a wiring line or an electrode) not illustrated.

The display control circuit 12 is provided in the frame region NA (see FIG. 1). The display control circuit 12 outputs control signals CS1 and CS3 to the scanning line/control line drive circuit 13, and outputs a control signal CS2 and an image signal VS to the data line drive circuit 14.

The scanning line/control line drive circuit 13 is provided in the frame region NA (see FIG. 1). The scanning line/control line drive circuit 13 drives the scanning lines G1 to Gm and the initialization control lines D0 to Dm-1 based on the control signal CS1. Additionally, the scanning line/control line drive circuit 13 drives the light emission control lines E1 to Em based on the control signal CS3.

The data line drive circuit 14 is provided in the frame region NA (see FIG. 1). The data line drive circuit 14 drives the data lines S1 to Sn based on the control signal CS2 and the image signal VS. Note that in the present embodiment, a pair of scanning line/control line drive circuits 13 are provided on both sides of the display portion 11. Both of the pair of scanning line/control line drive circuits 13 drive the scanning lines G1 to Gm, the light emission control lines E1 to Em, and the initialization control lines D0 to Dm-1.

More specifically, the scanning line/control line drive circuit 13 sequentially selects one scanning line among the scanning lines G1 to Gm based on the control signal CS1, and sets the level of a voltage to be applied to the selected scanning line to the on level (low level). Thus, n pixel circuits 20 connected to the selected scanning line are collectively selected.

In the present embodiment, the initialization control lines D1 to Dm-1 are connected to the scanning lines G1 to Gm-1, respectively. The initialization control line D0 is also used as the scanning line G0. The connections between the initialization control lines D1 to Dm-1 and the scanning lines G1 to Gm-1 will be described later.

The data line drive circuit 14 applies n data voltages corresponding to the image signal VS to the data lines S1 to Sn based on the control signal CS2. Thus, n data voltages are written to the n selected pixel circuits 20, respectively.

In addition, the scanning line/control line drive circuit 13 sets the level of a voltage to be applied to the light emission control line Ei to the on level (low level) in a light emission period of the pixel circuit 20 in the i-th row. The scanning line/control line drive circuit 13 sets the level of a voltage to be applied to the light emission control line Ei to the off level (high level) in a non-light emission period of the pixel circuit 20 in the i-th row. The organic EL element in the pixel circuit 20 in the i-th row emits light at a brightness corresponding to a data voltage written to the pixel circuit 20 when the level of the voltage applied to the light emission control line Ei is at the on level.

In the display device 10, m+1 horizontal periods (see FIG. 4) for selecting m+1 scanning lines are set in one frame period for displaying one image.

Figure 3:
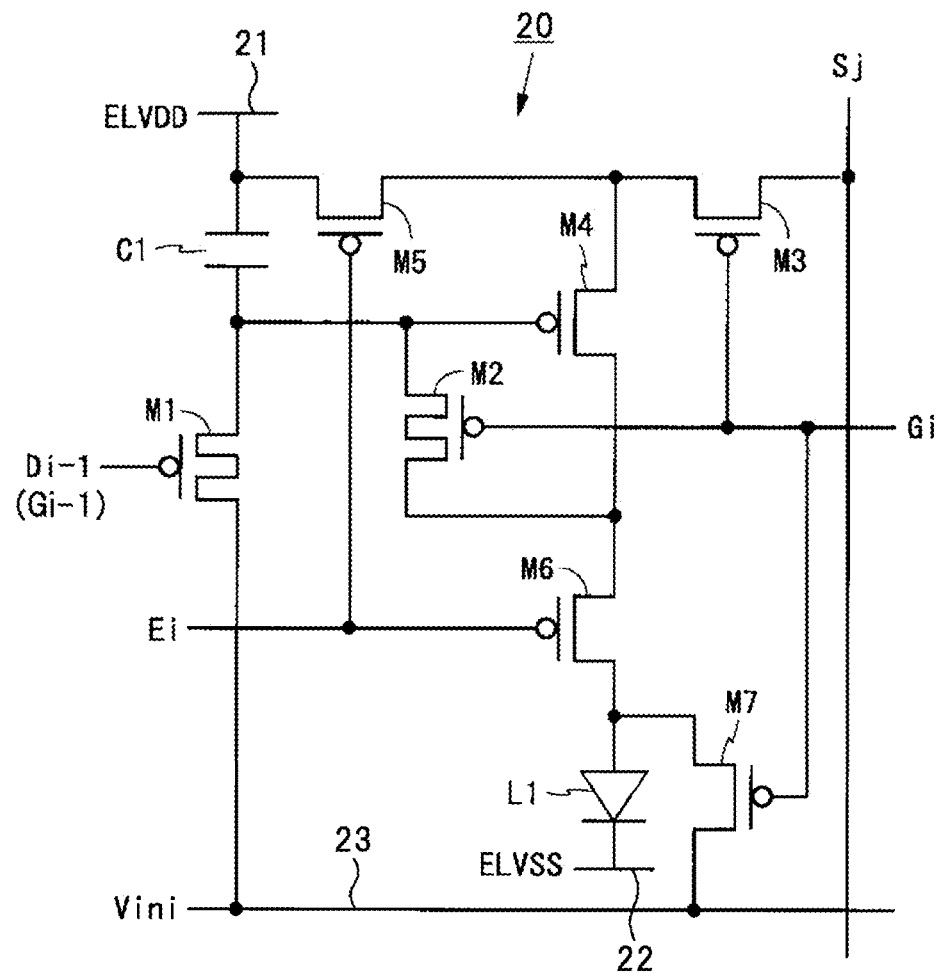
FIG. 3 is a circuit diagram of a pixel circuit included in the display device described above.

FIG. 3 is a circuit diagram of the pixel circuit 20. FIG. 3 illustrates the pixel circuit 20 at the i-th row and j-th column.

The pixel circuit 20 is provided in the display region DA (see FIG. 1), and includes seven transistors M1 to M7, a light-emitting element L1, and a capacitor C1. Additionally, a first power supply line 21, a second power supply line 22, and an initialization voltage line 23 are connected to the pixel circuit 20. The first power supply line 21 is connected to a power supply circuit, and is applied with the high-level power supply voltage ELVDD. The second power supply line 22 is connected to the power supply circuit, and is applied with the low-level power supply voltage ELVSS. The initialization voltage line 23 is connected to the power supply circuit, and is applied with an initialization voltage

*Vini*. Additionally, the scanning line Gi, the initialization control line Di-1, the light emission control line Ei, and the data line Sj are connected to the pixel circuit 20. The scanning line Gi, the initialization control line Di-1, and the light emission control line Ei are signal lines that transmit signals for controlling on/off of transistors. A data voltage Vd corresponding to data to be written to the pixel circuit 20 is applied to the data line Sj.

Each of the transistors M1 to M7 is a P-channel type thin film transistor (TFT) and includes a gate, a source, and a drain. Each of the transistors M1 and M2 is a double-gate transistor including two gates, and each of the transistors M3 to M7 is a single-gate transistor including one gate. The light-emitting element L1 is, for example, an organic electro luminescence (EL) element, and includes an anode and a cathode. The capacitor Cl is a capacitive element and includes a first electrode and a second electrode.

The transistor M1 is an initialization transistor, and controls initialization of a gate voltage of the transistor M4. The transistor M1 includes a gate connected to the initialization control line Di-1, a source connected to a gate of the transistor M4, and a drain connected to the initialization voltage line 23 (the initialization voltage *Vini*).

The transistor M2 is a threshold compensation transistor, and compensates for a threshold voltage of the transistor M4. The transistor M2 includes a gate connected to the scanning line Gi, a source connected to a drain of the transistor M4, and a drain connected to the gate of the transistor M4.

The transistor M3 is a writing control transistor and controls a data voltage applied to the gate of the transistor M4. The transistor M3 includes a gate connected to the scanning line Gi, a source connected to the data line Sj, and a drain connected to a source of the transistor M4.

The transistor M4 is a drive transistor, and controls a current flowing through the light-emitting element L1. The transistor M4 includes the gate connected to the source of the transistor M1, the drain of the transistor M2, and a first terminal of the capacitor C1, the source connected to the drain of the transistor M3 and a drain of the transistor M5, and the drain connected to a source of the transistor M6.

The transistor M5 is a light emission control transistor, and controls light emission of the light-emitting element L1. The transistor M5 includes a gate connected to the light emission control line Ei, a source connected to the first power supply line 21 (the high-level power supply voltage ELVDD) and a second terminal of the capacitor C1, and the drain connected to the source of the transistor M4.

The transistor M6 is a light emission control transistor, and controls light emission of the light-emitting element L1. The transistor M6 includes a gate connected to the light emission control line Ei, the source connected to the drain of the transistor M4, and a drain connected to the anode of the light-emitting element L1.

The transistor M7 is a light emission initialization transistor, and controls initialization of the light-emitting element L1. The transistor M7 includes a gate connected to the scanning line Gi, a source connected to the anode of the light-emitting element L1, and a drain connected to the initialization voltage line 23.

The capacitor C1 includes the first terminal connected to the gate of the transistor M4, and the second terminal connected to the source of the transistor M4 with the transistor M5 interposed therebetween. In addition, the second terminal of the capacitor Cl is connected to the first power supply line 21 (the high-level power supply voltage ELVDD). Thus, a voltage between both ends of the capacitor C1 is a differential voltage between the high-level power supply voltage ELVDD and the gate voltage of the transistor M4. When the transistor M5 is in the on state, a voltage between both ends of the capacitor C1 is applied between the gate and the source of the transistor M4.

The light-emitting element L1 includes an anode connected to the drain of the transistor M6 and the source of the transistor M7 and a cathode connected to the second power supply line 22 (the low-level power supply voltage ELVSS).

Note that each of the transistors M1 and M2 is not limited to the double-gate transistor, and may be a single-gate transistor similarly to the transistors M3 to M7.

Additionally, a transistor (TFT) included in the pixel circuit 20 may be an amorphous silicon transistor including a channel layer made of amorphous silicon, a low-temperature polysilicon transistor including a channel layer made of low-temperature polysilicon, or an oxide semiconductor transistor including a channel layer made of an oxide semiconductor. For example, indium gallium zinc oxide (IGZO) may be used as the oxide semiconductor. Additionally, a transistor (TFT) included in the pixel circuit 20 may be a top gate type or a bottom gate type. An N-channel type transistor may also be used instead of a P-channel type transistor. In the case of using the N-channel type transistor, the N-channel type transistor has polarities inverted with respect to the polarities of a signal and a voltage that are supplied to a P-channel type transistor.

Figure 5:
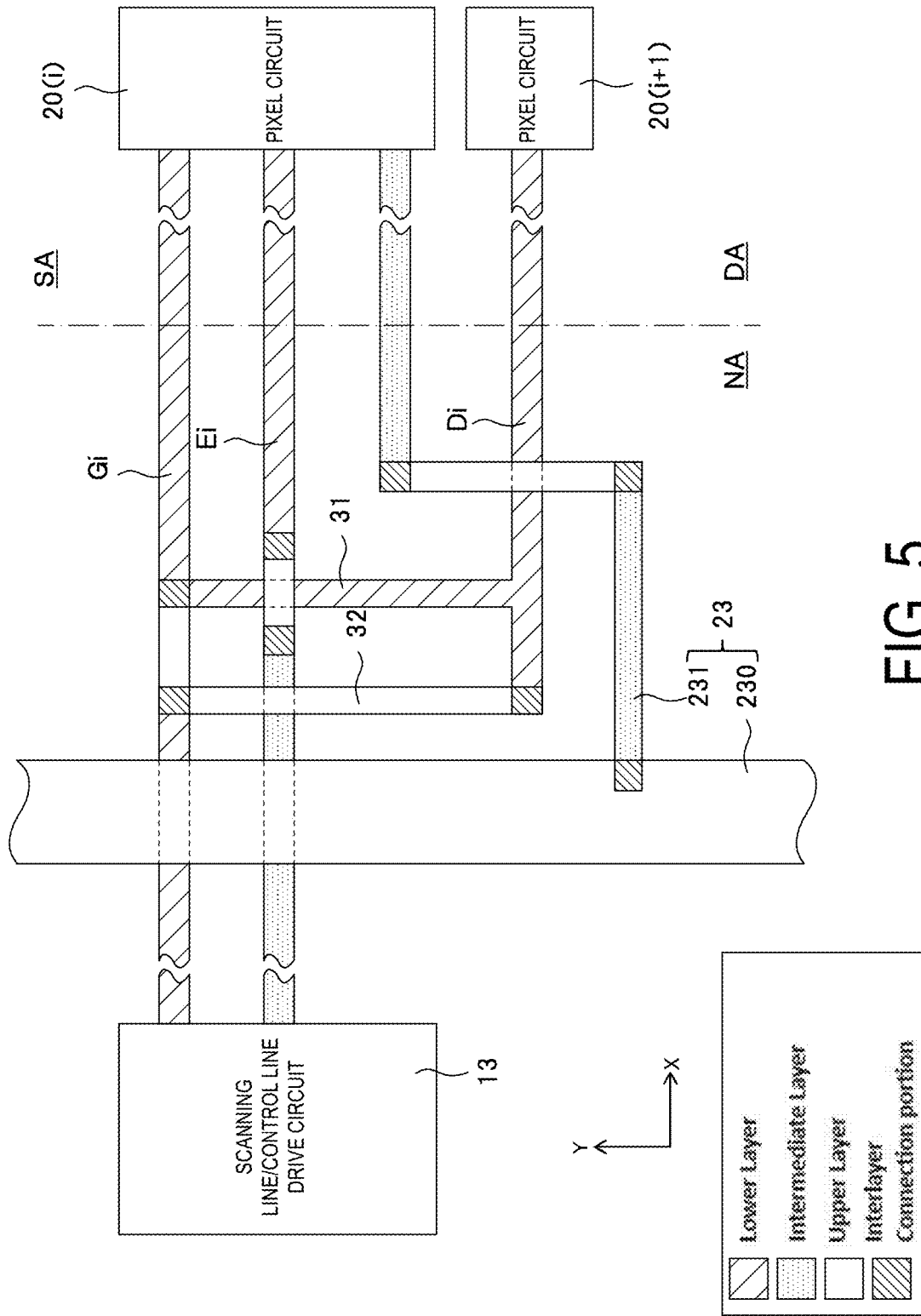
FIG. 5 is a schematic view illustrating a wiring line pattern at or near a linear portion of a display region in the display device described above.
Figure 6:
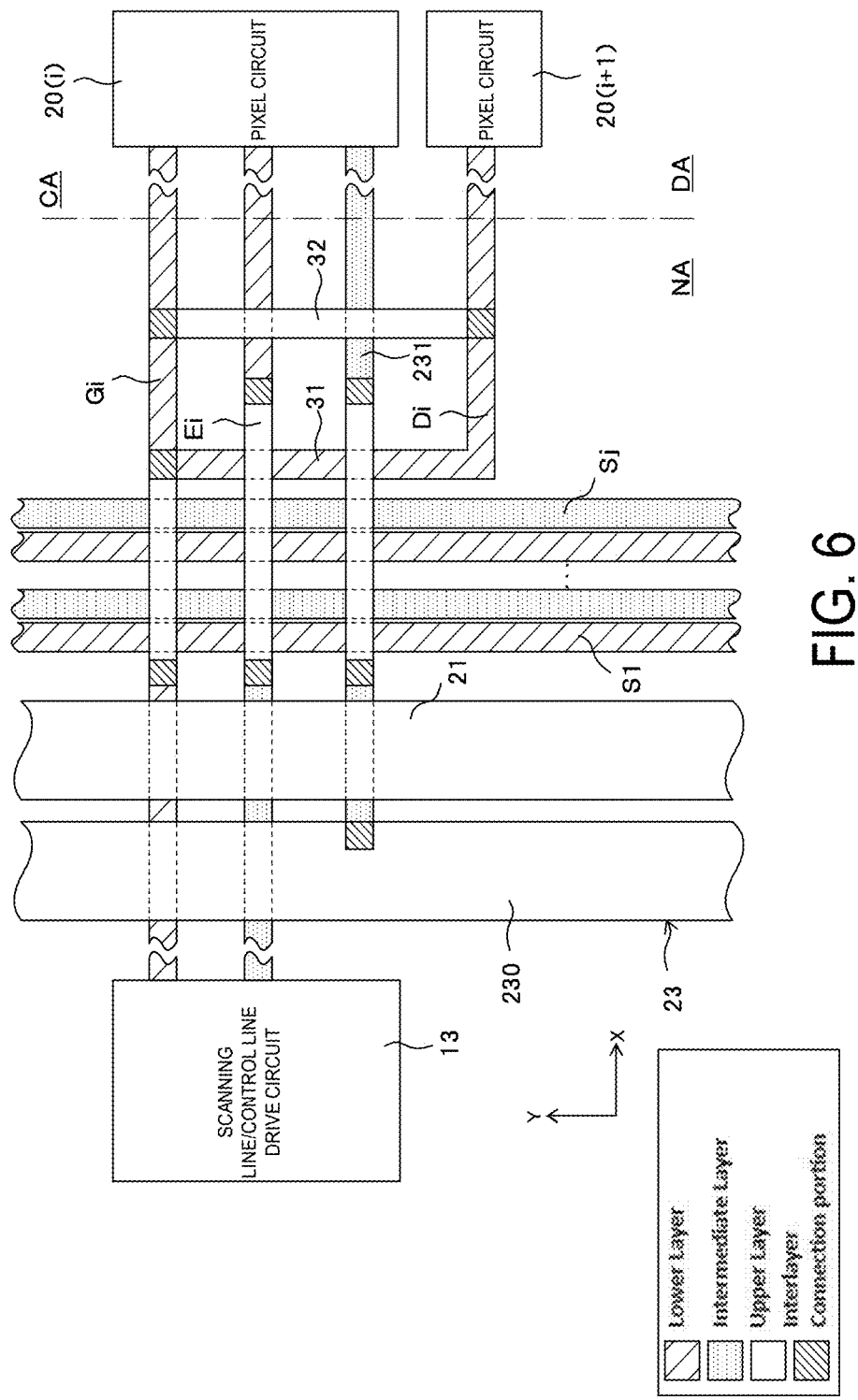
FIG. 6 is a schematic view illustrating a wiring line pattern at or near a corner portion of the display region in the display device described above.

Additionally, as illustrated in FIG. 5 and FIG. 6, in the present embodiment, the scanning line Gi connected to the pixel circuit 20(*i*) in the i-th row and the initialization control line Di connected to the pixel circuit 20(*i*+1) in the (i+1)-th row are connected to each other through the first connection line 31 and the second connection line 32. In other words, the initialization control line Di-1 connected to the pixel circuit 20(*i*) in the i-th row and the scanning line Gi-1 connected to the pixel circuit 20(*i*−1) in the (i−1)-th row are connected to each other through the first connection line 31 and the second connection line 32. Due to this, a voltage of the initialization control line Di-1 connected to the pixel circuit 20(*i*) in the i-th row is the same as a voltage of the scanning line Gi-1 connected to the pixel circuit 20(*i*−1) in the (i−1)-th row. Thus, the scanning lines and the initialization control lines can be partially commonly driven, so that the circuit configuration can be simplified.

Figure 4:
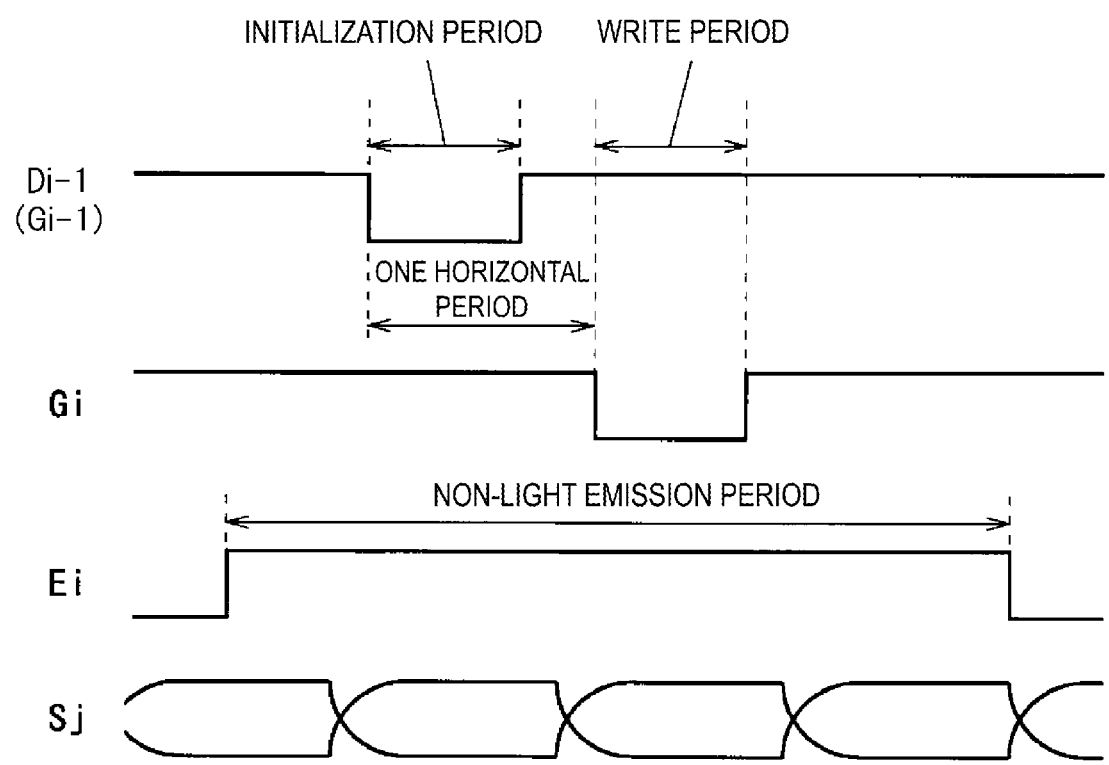
FIG. 4 is an operation waveform diagram of the pixel circuit described above.

Next, an operation of the pixel circuit 20 will be briefly described with reference to FIG. 4. FIG. 4 is a timing chart when a data voltage is written to the pixel circuit 20 at the i-th row and j-th column, and illustrates changes in voltage of the initialization control line Di−1, the scanning line Gi, the light emission control line Ei, and the data line Sj in order from the top.

First, it is assumed that the voltages of the initialization control line Di−1 and the scanning line Gi are at the high level (off level) and the voltage of the light emission control line Ei is at the low level (on level). In this case, the transistors M1 to M3 and M7 are turned to the off state, and the transistors M5 and M6 are turned to the on state. At this time, when a gate-source voltage of the transistor M4 is equal to or lower than a threshold voltage, a current is supplied from the first power supply line 21 to the light-emitting element L1 via the transistors M5, M4, and M6. The light-emitting element L1 emits light at a brightness corresponding to an amount of flowing current.

Next, a voltage of the light emission control line Ei changes from the low level (on level) to the high level (off level). This causes the transistors M5 and M6 to transition from the on state to the off state. When the transistors M5 and M6 are turned off, a current supplied to the light-emitting element L1 is cut off and the light-emitting element L1 is turned to a non-light emission state. In the present embodiment, a period during which the voltage of the light emission control line Ei is at the high level (off level) is referred to as a non-light emission period.

Next, the voltage of the initialization control line Di−1 changes from the high level (off level) to the low level (on level). This causes the transistor M1 to transition from the off state to the on state. When the transistor M1 is turned on, the gate of the transistor M4 is electrically conductive to the initialization voltage line 23 via the transistor M1. The initialization voltage $Vini$ applied to the initialization voltage line 23 is set to a relatively low voltage value (for example, −4 V) so that when the transistor M3 is turned to the on state and a voltage is applied to the source of the transistor M4, the gate-source voltage of the transistor M4 becomes equal to or lower than the threshold voltage and the transistor M4 is turned to the on state. Thus, when the transistor M1 is turned on, a current flows from the gate of the transistor M4 toward the initialization voltage line 23 via the transistor M1. That is, in the transistor M4, the gate is discharged, and the gate voltage decreases toward the initialization voltage $Vini$. In the present embodiment, making the gate voltage of the transistor M4 equal to the initialization voltage $Vini$ is referred to as initialization of the transistor M4 (drive transistor). Additionally, a period during which the voltage of the initialization control line Di−1 is at the low level (on level) is referred to as an initialization period.

Next, the voltage of the initialization control line Di−1 changes from the low level (on level) to the high level (off level). That is, the initialization period ends. This causes the transistor M1 to transition from the on state to the off state. When the transistor M1 is turned off, the gate of the transistor M4 and the first terminal of the capacitor C1 are electrically cut off from the initialization voltage line 23.

Next, the voltage of the scanning line Gi changes from the high level (off level) to the low level (on level). This causes the transistors M2, M3, and M7 to transition from the off state to the on state.

When the transistor M3 is turned on, the data voltage Vd of the data line Sj is applied to the source of the transistor M4 via the transistor M3. As described above, the initialization of the transistor M4 causes the gate voltage of the transistor M4 to be the initialization voltage $Vini$. Thus, when the source voltage of the transistor M4 becomes the data voltage Vd, the gate-source voltage of the transistor M4 (the differential voltage between the data voltage Vd and the initialization voltage $Vini$) becomes equal to or lower than a threshold voltage Vth, and the transistor M4 is turned on.

Additionally, since the transistor M2 is in the on state, the drain and the gate of the transistor M4 are electrically conductive to each other via the transistor M2. Thus, a current flows from the data line Sj to the gate of the transistor M4 via the transistors M3, M4, and M2. This causes the gate voltage of the transistor M4 to increase from the initialization voltage $Vini$. Then, when a gate-source voltage of the transistor M4 is at or higher than the threshold voltage Vth, the transistor M4 is turned off. When the transistor M4 is turned off, the path of the current flowing from the data line Sj to the transistor M4 is cut off, so that the data voltage of the transistor M4 stops rising. The gate voltage of the transistor M4 when the transistor M4 is turned off is a differential voltage (Vd −|Vth|) between the source voltage of the transistor M4 (the data voltage Vd) and the threshold voltage Vth. The gate voltage (Vd-|Vth|) of the transistor M4 is held by the capacitor C1. In this way, the value of the gate voltage of the transistor M4 becomes a value corresponding to the data voltage Vd of the data line Sj. In the present embodiment, setting the gate voltage of the transistor M4 (drive transistor) to a voltage corresponding to the data voltage Vd of the data line Sj is referred to as writing of data to the pixel circuit 20. Additionally, a period during which the voltage of the scanning line Gi is at the low level (on level) is referred to as a write period.

As described above, the initialization control line Di−1 is connected to the scanning line Gi−1 connected to the pixel circuit 20 (i−1) in the (i−1)-th row adjacent to the pixel circuit 20 (i) to which the initialization control line Di−1 is connected, the first connection line 31, and the second connection line 32. Thus, the initialization control line Di−1 and the scanning line Gi−1 have the same voltage. In the present embodiment, a period from a time point when the voltage of the initialization control line Di−1, that is, the voltage of the scanning line Gi−1 connected to the pixel circuit 20 (i−1) in the (i−1)-th row changes to the low level to a time point when the voltage of the scanning line Gi connected to the pixel circuit 20 (i) in the i-th row changes to the low level is referred to as a horizontal period. That is, in the plurality of pixel circuits 20 aligned in the row direction, the start points of the write periods are sequentially shifted by the horizontal period.

In addition, in the write period, since the transistor M7 is in the on state, the anode of the light-emitting element L1 is electrically conductive to the initialization voltage line 23 via the transistor M7. Accordingly, a current flows from the anode of the light-emitting element L1 toward the initialization voltage line 23 via the transistor M7, and the anode voltage of the light-emitting element L1 decreases toward the initialization voltage $Vini$. In the present embodiment, causing the anode voltage of the light-emitting element L1 to coincide with the initialization voltage $Vini$ is referred to as initialization of the light-emitting element L1.

Next, the voltage of the scanning line Gi changes from the low level (on level) to the high level (off level). That is, the write period is completed. Thus, the transistors M2, M3, and M7 transition from the on state to the off state.

At this time, a voltage between both ends of the capacitor C1 becomes a differential voltage (ELVDD—Vd+1Vt111) between the high-level power supply voltage ELVDD of the first power supply line 21 and the gate voltage (Vd-|Vth|) of the transistor M4.

Next, the voltage of the light emission control line Ei changes from the high level (off level) to the low level (on level). That is, the non-light emission period ends. Thus, the transistors M5 and M6 transition from the off state to the on state.

When the transistor M5 is turned on, the voltage between the both ends of the capacitor C1 is applied between the gate and the source of the transistor M4. That is, the gate-source voltage of the transistor M4 becomes the voltage (ELVDD—Vd+1Vt111) between the both ends of the capacitor C1, and the transistor M4 is turned to the on state. Thus, a current Id corresponding to a gate-source voltage Vgs of the transistor M4 flows from the first power supply line 21 to the light-emitting element L1 via the transistors M5, M4, and M6. Specifically, the current Id is expressed by the following Equation (1) using a constant K.

$$Id = K(\text{V}gs - |\text{V}th|)^2 \quad (1)$$
$$= K(ELVDD - \text{V}d + |\text{V}th| - |\text{V}th|)^2$$
$$= K(ELVDD - \text{V}d)^2$$

As described above, the light-emitting element L1 emits light at a brightness corresponding to data (the data voltage Vd) written to the pixel circuit 20 regardless of the threshold voltage Vth of the transistor M4. Thus, variation in brightness of the light-emitting elements L1 due to variation in threshold voltage Vth of the transistors M4 in the pixel circuits 20 can be suppressed.

Next, wiring line patterns of the scanning line Gi, the initialization control line Di, the light emission control line Ei, the initialization voltage line 23, the first connection line 31, and the second connection line 32 will be described with reference to FIG. 5 and FIG. 6.

FIG. 5 and FIG. 6 are enlarged plan views illustrating wiring line patterns of the first connection line 31, the second connection line 32, and the periphery thereof. Note that FIG. 5 and FIG. 6 are schematic views of wiring line patterns, and may be different from actual wiring line patterns. In addition, in FIG. 5 and FIG. 6, wiring line patterns other than the scanning line Gi, the initialization control line Di, the light emission control line Ei, the initialization voltage line 23, the first connection line 31, and the second connection line 32 are omitted as appropriate. In addition, in the following description, a direction along a short-side direction (a horizontal direction in FIG. 1) of the display region DA having a rectangular shape is referred to as an X direction, and a direction along a longitudinal direction (a vertical direction in FIG. 1) of the display region DA is referred to as a Y direction. The X direction is a row direction of the plurality of pixel circuits 20, and the Y direction is a column direction of the plurality of pixel circuits 20.

FIG. 5 is a schematic view of a wiring line pattern at or near a linear portion SA of the display region DA. FIG. 6 is a schematic view of a wiring line pattern at or near a corner portion CA of the display region DA. As illustrated in FIG. 1, the linear portion SA of the display region DA is a portion of a side along the longitudinal direction (Y direction) of the display region DA having a rectangular shape. The corner portion CA of the display region DA is a corner portion connecting a side along the longitudinal direction (Y direction) and a side along the short-side direction (X direction) in the display region DA having a rectangular shape.

In the present embodiment, a wiring line is formed across a plurality of layers aligned in the thickness direction of the display device 10. The plurality of layers includes an upper layer (second layer), a lower layer (first layer), and an intermediate layer (third layer). The upper layer (SE layer) is a layer closest to the surface of the display region DA in the display device 10 among the upper layer, the lower layer, and the intermediate layer. The lower layer (GE layer) is a layer farthest from the surface of the display region DA in the display device 10 among the upper layer, the lower layer, and the intermediate layer. The intermediate layer (M3 layer) is a layer formed between the upper layer and the lower layer. In FIG. 5 and FIG. 6, in order to distinguish wiring lines formed in each of the upper layer, the lower layer, and the intermediate layer from each other, a wiring line formed in the upper layer is outlined, a wiring line formed in the intermediate layer is indicated by light-colored dot hatching, and a wiring line formed in the lower layer is indicated by dark-colored dot hatching. In addition, an interlayer connection portion that connects layers of the upper layer, the lower layer, and the intermediate layer is indicated by hatching with oblique lines. Note that the upper layer, the intermediate layer, and the lower layer need not be continuous, and the plurality of layers may include a layer other than the upper layer, the intermediate layer, and the lower layer.

First, a wiring line pattern at or near the linear portion SA will be described with reference to FIG. 5.

As illustrated in FIG. 2, the scanning line/control line drive circuit 13 is provided on the both sides of the display portion 11 in the X direction in the frame region NA. Thus, the scanning line Gi and the light emission control line Ei that connect the scanning line/control line drive circuit 13 and the pixel circuit 20 (i) are aligned in the Y direction and formed along the X direction, as shown in FIG. 5. Additionally, the initialization voltage line 23 includes a trunk line 230 and a branch line 231 branched from the trunk line 230. The trunk line 230 is formed along the Y direction in the frame region NA. The branch line 231, the scanning line Gi, and the light emission control line Ei are aligned in the Y direction, and are formed along the X direction. The branch line 231 connects the trunk line 230 and the pixel circuit 20 (i).

In addition, in the present embodiment, the scanning line Gi connected to the pixel circuit 20 (i) in the i-th row is connected to the initialization control line Di connected to the pixel circuit 20 (i+1) in the (i+1)-th row through the first connection line 31 and the second connection line 32. The initialization control line Di is aligned in the Y direction together with the scanning line Gi, the light emission control line Ei, and the branch line 231 of the initialization voltage line 23, and is formed along the X direction. In the present embodiment, the scanning line Gi, the light emission control line Ei, the branch line 231 of the initialization voltage line 23, and the initialization control line Di are aligned in this order in the Y direction. Additionally, the first connection line 31 and the second connection line 32 are formed along the Y direction. That is, the first connection line 31 and the second connection line 32 are formed extending in the Y direction orthogonal to the X direction in which the scanning line Gi extends. Further, the first connection line 31 and the second connection line 32 are formed side by side in the X direction in which the scanning line Gi extends.

Specifically, the trunk line 230 of the initialization voltage line 23 is formed in the upper layer. The scanning line/control line drive circuit 13 is provided on a side opposite to the display region DA with respect to the trunk line 230 in the X direction. In the lower layer, the scanning line Gi connected to the scanning line/control line drive circuit 13 intersects the trunk line 230 formed in the upper layer. Further, in the intermediate layer, the light emission control line Ei connected to the scanning line/control line drive circuit 13 intersects the trunk line 230 formed in the upper layer.

In the scanning line Gi, a pair of interlayer connection portions that connect the upper layer and the lower layer are formed between the trunk line 230 and the display region DA. The scanning line Gi is formed in the upper layer between the pair of interlayer connection portions. In addition, the scanning line Gi is formed in the lower layer between the pixel circuit 20 (i) and the interlayer connection portion on the display region DA side (the right side in FIG. 5) of the pair of interlayer connection portions, and is connected to the first connection line 31 formed in the lower layer. That is, the first connection line 31 is connected to a portion closer to the display region DA (the plurality of pixel circuits 20) than a part of the scanning line Gi (between the pair of interlayer connection portions) formed in the upper layer. Further, in the scanning line Gi, the interlayer connection portion on the trunk line 230 side (the left side in FIG. 5) of the pair of interlayer connection portions is connected to the second connection line 32 formed in the upper layer.

The initialization control line Di is formed on a side closer to the display region DA (the right side in FIG. 5) than the trunk line 230 in the X direction. The initialization control line Di is formed in the lower layer. The initialization control lines Di are formed along the X direction spaced apart from each other in the Y direction.

The first connection line 31 is formed in the lower layer in the frame region NA. The first connection line 31 connects the interlayer connection portion on the display region DA side (the right side in FIG. 5) of the pair of interlayer connection portions in the scanning line Gi and the interlayer connection portion formed at the end portion on the trunk line 230 side in the initialization control line Di. That is, the first connection line 31 is formed on a side closer to the display region DA than the trunk line 230 in the X direction. Further, the first connection line 31 is formed along the Y direction.

The second connection line 32 is formed in the upper layer in the frame region NA. The second connection line 32 connects the interlayer connection portion on the trunk line 230 side of the pair of interlayer connection portions in the scanning line Gi and the interlayer connection portion formed at the end portion on the trunk line 230 side in the initialization control line Di. That is, the second connection line 32 is formed between the trunk line 230 and the first connection line 31 in the X direction. In other words, the first connection line 31 is provided at a position closer to the display region DA (the plurality of pixel circuits 20) than the second connection line 32.

Additionally, the first connection line 31 and the second connection line 32 intersect, of the light emission control line Ei and the initialization voltage line 23, at least the light emission control line Ei. In other words, the light emission control line Ei intersects the first connection line 31 and the second connection line 32. Specifically, in the intermediate layer, the light emission control line Ei intersects the second connection line 32 formed in the upper layer. In addition, in the light emission control line Ei, an interlayer connection portion connecting the intermediate layer and the upper layer is formed between the first connection line 31 and the second connection line 32. In the upper layer, the light emission control line Ei intersects the first connection line 31 formed in the lower layer. In addition, in the light emission control line Ei, an interlayer connection portion that connects the upper layer and the lower layer is formed between the first connection line 31 and the display region DA. The light emission control line Ei is connected to the pixel circuit 20 (i) in the lower layer.

The trunk line 230 of the initialization voltage line 23 is formed in the upper layer. In the trunk line 230, an interlayer connection portion connecting the upper layer and the intermediate layer is formed. The branch line 231 is branched from the interlayer connection portion of the trunk line 230, and is formed in the intermediate layer. The interlayer connection portion formed in the trunk line 230 is formed on a side opposite to the scanning line Gi with respect to the initialization control line Di in the Y direction.

Additionally, the branch line 231 is branched from the trunk line 230 in the intermediate layer. In the branch line 231, a pair of interlayer connection portions connecting the intermediate layer and the upper layer are formed. The pair of interlayer connection portions in the branch line 231 are formed on a side closer to the display region DA (the right side in FIG. 5) than the first connection line 31 and the second connection line 32. Additionally, the pair of interlayer connection portions in the branch line 231 are formed side by side in the Y direction, and are formed on both sides of the initialization control line Di in the Y direction. The branch line 231 is formed in the upper layer between the pair of interlayer connection portions. In the upper layer, the branch line 231 intersects the initialization control line Di formed in the lower layer. A part of the branch line 231 is formed in the intermediate layer along the X direction between the initialization control line Di and the light emission control line Ei in the Y direction.

That is, the initialization voltage line 23 bypasses the first connection line 31 and the second connection line 32 and intersects the initialization control line Di. In other words, the first connection line 31 and the second connection line 32 intersect, of the light emission control line Ei and the initialization control line Di, only the light emission control line Ei. Additionally, the initialization voltage line 23 intersects the initialization control line Di.

Further, the initialization control line Di is formed in the lower layer (first layer), and the initialization voltage line 23 intersects the initialization control line Di in the upper layer (second layer) different from the lower layer. The intermediate layer (third layer) is formed between the upper layer and the lower layer. That is, the initialization control line Di and the initialization voltage line 23 intersect each other in the layers more distant from each other.

Note that in FIG. 5, only the wiring line pattern at or near the linear portion SA on one side (the left side in FIG. 1) of the display region DA in the X direction is illustrated, but the same or similar applies to the wiring line pattern at or near the linear portion SA on the other side (the right side in FIG. 1) of the display region DA. That is, in the display device 10 according to the present embodiment, the scanning line Gi and the initialization control line Di are connected to each other by the first connection line 31 and the second connection line 32 on both sides of the display region DA. Thus, in the display device 10 according to the present embodiment, a loop wiring line is formed by the scanning line Gi, the initialization control line Di, a pair of first connection lines 31, and a pair of second connection lines 32. Specifically, a loop wiring line including the pair of first connection lines 31 and a loop wiring line including the pair of second connection lines 32 are formed. In addition, the loop wiring line including the scanning line Gi, the initialization control line Di, and the pair of first connection lines 31 is formed in the same layer (lower layer).

As described above, in the display device 10 according to the present embodiment, the scanning line Gi connected to the pixel circuit 20 (i) in the i-th row and the initialization control line Di connected to the pixel circuit 20 (i+1) in the (i+1)-th row are connected to each other by using two connection lines (the first connection line 31 and the second connection line 32). Thus, a wiring line resistance between the scanning line Gi and the initialization control line Di is reduced as compared with the case where the scanning line Gi and the initialization control line Di are connected by using one connection line.

The initialization control line Di is connected to the transistor M1 (initialization transistor) in the pixel circuit 20 (i+1) in the (i+1)-th row (see FIG. 2). In the initialization period (see FIG. 3), when the voltage of the initialization control line Di changes from the high level to the low level, the transistor M1 is turned to the on state. Here, in a case where a parasitic capacitance is generated between the initialization control line Di and the initialization voltage line 23, even when the voltage of the initialization control line Di changes from the high level to the low level, there is a possibility that the transistor M1 does not become a saturation region but becomes an active region due to residual charges caused by the parasitic capacitance. In this case, a current flowing from the gate of the transistor M4 (drive transistor) to the initialization voltage line 23 via the transistor M1 is reduced, and there is a possibility that the gate voltage of the transistor M4 does not match the initialization voltage Vini in the initialization period, that is, the initialization is not completed. As a result, the image quality of a display image displayed in the display region DA may be deteriorated.

In the present embodiment, since the wiring line resistance between the initialization control line Di and the scanning line Gi is reduced by the two connection lines (the first connection line 31 and the second connection line 32), even when a parasitic capacitance is generated between the initialization control line Di and the initialization voltage line 23, residual charges applied to the gate of the transistor M1 are easily discharged in the initialization period. This causes the transistor M1 to easily operate in the saturation region, which can suppress incompletion of the initialization of the transistor M4 and suppress deterioration in image quality of a display image.

Furthermore, in the present embodiment, the initialization voltage line 23 bypasses the first connection line 31 and the second connection line 32 so as not to intersect the first connection line 31 and the second connection line 32. This can reduce a parasitic capacitance between the initialization voltage line 23 and the first connection line 31 and a parasitic capacitance between the initialization voltage line 23 and the second connection line 32. Thus, a parasitic capacitance between the initialization control line Di and the initialization voltage line 23 that are connected to the first connection line 31 and the second connection line 32 is reduced, which can suppress the deterioration in the image quality of a display image.

In addition, the initialization voltage line 23 intersects the initialization control line Di while bypassing the first connection line 31 and the second connection line 32. In the upper layer, the initialization voltage line 23 intersects the initialization control line Di formed in the lower layer. At least the intermediate layer is present between the upper layer and the lower layer. Thus, the initialization voltage line 23 and the initialization control line Di intersect each other in layers more distant from each other. This can further reduce the parasitic capacitance between the initialization voltage line 23 and the initialization control line Di, and can suppress deterioration in the image quality of a display image.

Additionally, in the present embodiment, a loop wiring line is formed by the scanning line Gi, the initialization control line Di, the pair of first connection lines 31, and the pair of second connection lines 32. Further, in the loop wiring line, the scanning line Gi, the initialization control line Di, and the pair of first connection lines 31 are formed in the same layer (lower layer). Here, due to an increase in the area of the lower layer wiring line caused by the loop wiring line of the scanning line Gi, the initialization control line Di, and the pair of first connection lines 31 being formed in the same layer (lower layer), there is a possibility that an influence such as a delay of the shift time of the voltage level of the scanning line Gi may occur. In this case, cutting at least one first connection line 31 of the pair of first connection lines 31 eliminates the loop wiring line in the same layer, and suppresses the influence described above. In the present embodiment, since the scanning line Gi and the initialization control line Di are connected to each other also by the pair of second connection lines 32, even when at least one of the first connection lines 31 is disconnected, an electrical connection state between the scanning line Gi and the initialization control line Di is maintained. As described above, in the present embodiment, it is possible to change the wiring line pattern while maintaining the connection state between the scanning line Gi and the initialization control line Di.

Next, a wiring line pattern at or near the corner portion CA will be described with reference to FIG. 6. Note that description of a wiring line pattern similar to the wiring line pattern at or near the linear portion SA (see FIG. 5) will be omitted as appropriate.

In the corner portion CA, the first power supply line 21 and the plurality of data lines S1 to Sj are provided between the trunk line 230 of the initialization voltage line 23 and the display region DA.

The first power supply line 21 is formed along the Y direction. The first power supply line 21 is formed in the upper layer. In the lower layer, the scanning line Gi intersects the first power supply line 21 formed in the upper layer. In the intermediate layer, the light emission control line Ei intersects the first power supply line 21 formed in the upper layer. In the intermediate layer, the branch line 231 branched from the trunk line 230 of the initialization voltage line 23 intersects the first power supply line 21 formed in the upper layer.

A plurality of data lines S1 to Sj are formed side by side in the X direction. To be specific, the plurality of data lines Si to Sj are formed such that data lines formed in the lower layer and data lines formed in the intermediate layer are alternately arranged in the X direction.

A pair of interlayer connection portions connecting the upper layer and the lower layer are formed in the scanning line Gi. In the upper layer between the pair of interlayer connection portions, the scanning line Gi intersects the plurality of data lines Si to Sj.

In the light emission control line Ei, an interlayer connection portion connecting the intermediate layer and the upper layer is formed between the first power supply line 21 and the plurality of data lines Si to Sj, and an interlayer connection portion connecting the upper layer and the lower layer is formed between the plurality of data lines S1 to Sj and the display region DA. In the corner portion CA, positions of the first connection line 31 and the second connection line 32 in the X direction are opposite to those in the linear portion SA (see FIG. 5). That is, in the corner portion CA, the first connection line 31 is formed between the trunk line 230 and the second connection line 32 in the X direction. In the upper layer between the pair of interlayer connection portions, the light emission control line Ei intersects the plurality of data lines S1 to Sj and the first connection line 31 formed in the lower layer. Further, of the pair of interlayer connection portions formed in the light emission control line Ei, the interlayer connection portion connecting the upper layer and the lower layer is formed between the first connection line 31 and the second connection line 32 in the X direction. In the lower layer, the light emission control line Ei intersects the second connection line 32 formed in the upper layer.

In the branch line 231 of the initialization voltage line 23, a pair of interlayer connection portions that connect the intermediate layer and the upper layer are formed side by side in the X direction. Of the pair of interlayer connection portions in the branch line 231, the interlayer connection portion formed on the display region DA side is formed between the first connection line 31 and the second connection line 32 in the X direction. In the upper layer between the pair of interlayer connection portions, the branch line 231 intersects the plurality of data lines Si to Sj and the first connection line 31 formed in the lower layer. Additionally, in the intermediate layer, the branch line 231 intersects the second connection line 32 formed in the upper layer. A part of the branch line 231 is formed in the intermediate layer along the X direction between the initialization control line Di and the light emission control line Ei in the Y direction.

As described above, in the present embodiment, the scanning line Gi and the initialization control line Di are connected to each other by the first connection line 31 and the second connection line 32 also in the corner portion CA (see FIG. 6) similarly to the linear portion SA (see FIG. 5). Thus, since the wiring line resistance between the initialization control line Di and the scanning line Gi is reduced by the two connection lines (the first connection line 31 and the second connection line 32), even when a parasitic capacitance is generated between the initialization control line Di and the initialization voltage line 23, residual charges applied to the gate of the transistor M1 can be easily discharged in the initialization period. This causes the transistor M1 to easily operate in the saturation region, which can suppress incompletion of the initialization of the transistor M4 and can suppress deterioration in the image quality of a display image displayed in the display region DA.

Note that in the above-described example, the scanning line Gi and the initialization control line Di are connected by the two connection lines (the first connection line 31 and the second connection line 32), but may be connected by one connection line (the first connection line 31 or the second connection line 32). In this case, it is preferable that the initialization voltage line 23 do not intersect the connection line that connects the scanning line Gi and the initialization control line Di and intersect the initialization control line Di. Further, it is preferable that in the upper layer, the initialization voltage line 23 intersect the initialization control line Di formed in the lower layer. This reduces the parasitic capacitance between the initialization control line Di and the initialization voltage line 23, which can suppress deterioration in the image quality of a display image.

Alternatively, although the lower layer is the first layer and the upper layer is the second layer in the above-described example, the lower layer may be the second layer and the upper layer may be the first layer.

The invention claimed is:

1. A display device comprising:
a plurality of pixel circuits;
a scanning line, a light emission control line, and an initialization voltage line that are connected to first pixel circuits, among the plurality of pixel circuits, within a corresponding row;
an initialization control line that is connected to second pixel circuits, among the plurality of pixel circuits, within a next row; and
two first connection lines and two second connection lines connecting the scanning line to the initialization control line,
wherein each of the plurality of pixel circuits includes:
a light-emitting element,
a drive transistor configured to drive the light-emitting element,
a light emission control transistor configured to control light emission of the light-emitting element,
a writing control transistor configured to control writing of data to the pixel circuit that includes the writing control transistor, and
an initialization transistor connected between a gate of the drive transistor and the initialization voltage line,
the scanning line is connected to a gate of each writing control transistor that is included in each of the first pixel circuits,
the initialization control line is connected to a gate of each initialization transistor that is included in each of the second pixel circuits,
the light emission control line is connected to a gate of each light emission control transistor that is included in each of the first pixel circuits,
the two first connection lines are formed in a layer different from a layer in which the two second connection lines are formed,
one of the two first connection lines and one of the two second connection lines are formed side by side and adjacent to each other, and
another one of the two first connection lines and another one of the two second connection lines are formed side by side and adjacent to each other,
the display device further comprising:
a display region provided with the plurality of pixel circuits; and
a frame region provided around the display region,
wherein the two first connection lines are formed respectively in the frame region sandwiching the display region,
the two first connection lines, the scanning line, and the initialization control line form a circular wiring as a whole,
the circular wiring is all formed in the first layer,
the light emission control line is formed between the scanning line and the initialization control line, and has a first portion in the display region and a second portion in the frame region,
the first portion is formed in the first layer,
the second portion is formed in the first layer and a second layer different from the first layer, and
in the frame region, a part of the light emission control line is formed in the second layer and an orthographic projection of the part of the light emission control line intersects an orthographic projection of the two first connection lines.

2. The display device according to claim 1, wherein the two first connection lines and the two second connection lines intersect, in an orthographic projection, at least the light emission control line of the light emission control line and the initialization voltage line.

3. The display device according to claim 1, wherein one of the two first connection lines and one of the two second connection lines intersect, in an orthographic projection, only the light emission control line of the light emission control line and the initialization voltage line, and
the initialization voltage line intersects, in an orthographic projection, the initialization control line.

4. The display device according to claim 3, wherein the initialization voltage line intersects, in the orthographic projection, the initialization control line in the first layer.

5. The display device according to claim 1,
wherein the two second connection lines are provided in the frame region.

6. The display device according to claim 1,
wherein the two first connection lines and the two second connection lines are formed extending in a direction orthogonal to an extending direction of the scanning line.

7. The display device according to claim 1,
wherein one of the two first connection lines and one of the two second connection lines are formed side by side in an extending direction of the scanning line.

8. The display device according to claim 1,
wherein one of the two first connection lines is provided at a position closer to the plurality of pixel circuits than one of the two second connection lines.

9. The display device according to claim 8,
wherein a part of the scanning line is formed in a layer identical to a layer provided with the two second connection lines, and
each of the two first connection lines is connected to a portion of the scanning line closer to the plurality of pixel circuits than the part of the scanning line.

10. The display device according to claim 1,
wherein one of the two first connection lines and one of the two second connection lines are formed side by side and adjacent to each other, such that a wiring line resistance between the scanning line and the initialization control line is reduced as compared to a wiring line resistance between the scanning line and the initialization control line with only one connection line, among the one of the two second connection lines and one of the two first connection lines, connecting the scanning line to the initialization control line.

11. A display device comprising:
a plurality of pixel circuits;
a scanning line and a light emission control line that are connected to first pixel circuits, among the plurality of pixel circuits, within a corresponding row;
an initialization control line that is connected to second pixel circuits, among the plurality of pixel circuits, within a next row;
two first connection lines connecting the scanning line to the initialization control line;
a display region provided with the plurality of pixel circuits; and
a frame region provided around the display region,
wherein the two first connection lines are formed respectively in the frame region sandwiching the display region,
the two first connection lines, the scanning line, and the initialization control line form a circular wiring as a whole,
the circular wiring is all formed in the first layer,
the light emission control line is formed between the scanning line and the initialization control line, and has a first portion in the display region and a second portion in the frame region,
the first portion is formed in the first layer,
the second portion is formed in the first layer and a second layer different from the first layer,
in the frame region, a part of the light emission control line is formed in the second layer and an orthographic projection of the part of the light emission control line intersects an orthographic projection of the two first connection lines, and
the display device further comprises:
an initialization voltage line including a trunk line, wherein
the trunk line is parallel to a direction in which the two first connection lines extend and is formed in the second layer.

* * * * *